United States Patent [19]

Kadota

[11] Patent Number: 5,039,624
[45] Date of Patent: Aug. 13, 1991

[54] METHOD OF MANUFACTURING A BIPOLAR TRANSISTOR

[75] Inventor: Yasuo Kadota, Tokyo, Japan

[73] Assignee: NEC Corporation, Japan

[21] Appl. No.: 343,956

[22] Filed: Apr. 26, 1989

[30] Foreign Application Priority Data

Apr. 26, 1988 [JP] Japan ................... 63-105216

[51] Int. Cl.⁵ .......................................... H01L 21/331
[52] U.S. Cl. .......................................... 437/31; 437/33; 437/909; 437/67; 437/72; 437/186; 437/162; 148/DIG. 11; 148/DIG. 124; 148/DIG. 10
[58] Field of Search ................ 437/31, 32, 33, 909, 437/917, 67, 72, 186, 162; 148/DIG. 10, DIG. 11, DIG. 124

[56] References Cited

U.S. PATENT DOCUMENTS

| 4,319,932 | 3/1982 | Jambotkar | 437/909 |
| 4,381,953 | 5/1983 | Ho et al. | 437/909 |
| 4,545,114 | 10/1985 | Ito et al. | 437/31 |
| 4,640,721 | 2/1987 | Uehara et al. | 437/909 |
| 4,641,416 | 2/1987 | Iranmanesh et al. | 437/31 |
| 4,782,030 | 11/1988 | Katsumata et al. | 437/186 |
| 4,800,171 | 1/1989 | Iranmanesh et al. | 437/31 |

FOREIGN PATENT DOCUMENTS 0107572 6/1984 Japan ........................... 437/909

OTHER PUBLICATIONS

Shinsuke Konaka, Yousuke Yamamoto and Tetsushi Sakai, *IEEE Transaction on Electron Devices*, vol. ED-33, No. 4, Apr. 1986.

Primary Examiner—Brian E. Hearn
Assistant Examiner—Tuan Nguyen

[57] ABSTRACT

A bipolar transistor having an intrinsic base portion for forming emitter-base PN junction with an emitter region and an extrinsic base portion for connecting a base electrode is disclosed. A concavity is formed between the intrinsic and extrinsic base portions, and the intrinsic base portion is electrically connected to the base electrode through a passage formed under the concavity and through the extrinsic base portion. The emitter region is contacted at its side to an insulating film formed in the concavity.

8 Claims, 8 Drawing Sheets

METHOD OF MANUFACTURING A BIPOLAR TRANSISTOR

BACKGROUND OF THE INVENTION

1. Field of the Invention

The present invention relates to a bipolar transistor and a method of manufacturing the same, and more particularly, to a bipolar transistor in which both of the base and emitter regions are formed in a self-aligned manner.

2. Description of Related Art

To reduce the base resistance and base-collector junction capacitance, SST (super self-aligned technology) is useful as proposed, for example, by S. Konaka et al. entitled "A 30-ps Si Bipolar IC Using Super Self-Aligned Process Technology" in IEEE TRANSACTIONS ON ELECTRON DEVICES, VOL. ED-33, NO. 4, APRIL 1986 pp. 526-531. In the SST, a standard aperture having a minimum size (for example, of 1 μm) accomplished by a conventional photo-lithography technology is formed in an insulating film or in a polycrystalline silicon film at an earlier process step in a process for forming the transistor, and the base region including the graft base region and the emitter region are formed in a self-aligned manner by using the standard aperture. Therefore, the base resistance and base-collector junction capacitance can be reduced, and the high-frequency characteristics can be improved. Similar technologies are disclosed in U.S. Pat. No. 4,495,512 by R. D. Issac et al. or in U.S. Pat. No. 4,157,269 by T. H. Ning et al.

In the above-mentioned conventional bipolar transistors, however, the emitter region forms the emitter-base junction capacitance at its side encircling the region as well as at its bottom. Moreover, the graft base region is formed at a position outside the standard aperture in the plan view. Therefore, a limitation is imposed on further reducing the emitter-base junction capacitance, base-collector junction capacitance and base resistance and on improving the highfrequency characteristics such as cut-off frequency characteristic.

SUMMARY OF THE INVENTION

Accordingly, it is one object of the present invention to provide an improved bipolar transistor which has good high-frequency characteristics as a result of small emitter-base and base-collector junction capacitances and small base resistance.

Another object of the present invention is to provide an effective method of manufacturing the improved bipolar transistor.

According to one feature of the present invention, there is provided a bipolar transistor which comprises a base region including an intrinsic base portion (active base region) and an extrinsic base portion (graft base region, contact portion, or inactive base region) a base electrode connected to the extrinsic base portion, a concavity formed between the intrinsic base portion and the extrinsic base portion such that the intrinsic base portion is electrically connected to the base electrode through a passage under the concavity and through the extrinsic base portion, an insulating film formed within the concavity and covering the wall of the concavity, an emitter region, the emitter region having an upper surface, a bottom attached to the intrinsic base portion to form a PN junction therebetween, and a side encircling the emitter region and attached to the insulating film in the concavity, and an emitter electrode connected to the upper surface of the emitter region. Generally, the extrinsic base portion has an impurity concentration higher than an impurity concentration of the intrinsic base portion. The base and emitter electrodes may be made of polycrystalline silicon, respectively. The passage under the concavity may consist of a part of the extrinsic base portion and/or a part of the intrinsic base portion. Further, the insulating film may include a thin silicon oxide film directly attached to the wall of the concavity and a silicon nitride layer formed on the thin silicon oxide film to fill the concavity. Or else, the insulating film may include a silicon oxide layer containing impurities such as borons directly attached to the wall of the concavity and filling the concavity.

According to another feature of the present invention, there is provided a bipolar transistor which comprises a semiconductor substrate including a semiconductor body of a first conductivity type, a monocrystalline semiconductor layer of a second conductivity type opposite to the first conductivity type formed on the semiconductor body to form a collector region of the transistor and having an upper surface, and a burried layer of the second conductivity type formed between the semiconductor layer and the semiconductor body and having a higher impurity concentration than the semiconductor layer; an isolation region surrounding the semiconductor layer; a groove of a ring-like plan shape formed in the semiconductor layer from the upper surface inwardly, and having a bottom; an insulating film formed in the groove; a base region of the first conductivity type formed in the semiconductor layer from the upper surface inwardly, the base region including an active portion surrounded by the groove of ring-like plan shape, a contact portion surrounding the groove of ring-like plan shape, and a passage portion connecting the active portion and the contact portion and formed under the bottom of the groove; an emitter region of the second conductivity type formed in the active portion of the base region, the emitter region having an upper surface, a bottom forming a PN junction with the active portion of the base region and a side encircling the emitter region and contacted to the insulating film in the groove; a base electrode made of polycrystalline silicon of the first conductivity type and contacted to the contract portion of the base region; and an emitter electrode of polycrystalline silicon of the second conductivity type and contacted to the upper surface of the emitter region.

According to another aspect of the present invention, there is provided a method of manufacturing a bipolar transistor comprising the steps of forming a covering layer on a surface of a first conductivity type of a semiconductor substrate; forming an aperture in the covering layer to expose a section of the surface of the substrate; forming a side wall layer made of material resistant against oxidation on a periphery part of the section and on the covering layer within the aperture to expose a center part of the section; carrying out a heat treatment under oxidizing atmosphere to form an oxide film on the exposed center part of the section of the surface; removing the side wall layer to expose the periphery part of the section of the surface; introducing impurities of a second conductivity type opposite to the first conductivity type into the periphery part to form an extrinsic base portion of the second conductivity type contacted to an edge of the oxide film; forming a concavity in the periphery part of the surface section at a position adjacent to the edge of the oxide film such that wall portions of the concavity including the bottom remoted from the edge of the oxide film are of the second conductivity type constituted by the extrinsic base portion and wall portions of the concavity contacted to and in the vicinity of the edge of the oxide film are of the first conductivity type; forming an insulating film within the concavity to cover the wall portions of the first and second conductivity types, entirely; forming intrinsic base portion of the second conductivity type in the center part of the surface section and along the concavity to connect to the extrinsic base portion; and forming an emitter region of the first conductivity type within the intrinsic base portion such that the emitter region is contacted to the insulating film within the concavity at its side.

According to the present invention, the side of the emitter region is contacted to the insulating film formed in the concavity so that a parasitic PN junction capacitance at the side does not occur. Therefore, good high-frequency characteristics and high speed operation of the transistor can be obtained. Moreover, the extrinsic base portion, that is, the graft base region is positioned inside the aperture in the plan view, which aperture is the standard aperture having a minimum size accomplished by a conventional photo-lithography technology. Therefore, the base region can be small size, and the base resistance and base-collector junction capacitance can be reduced. Consequently, the advantages mentioned above are further enhanced.

DESCRIPTION OF A PRIOR ART

Figure 1:
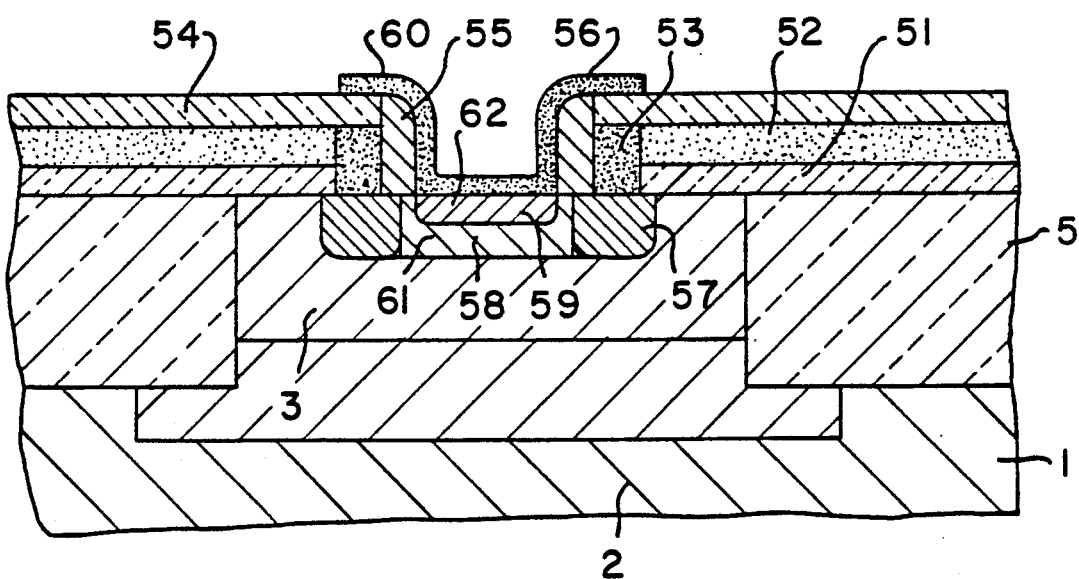
FIG. 1 is a cross-sectional view showing a bipolar transistor in a prior art.

Referring to FIG. 1, a silicon substrate include a P-type silicon body 1, an N-type epitaxial silicon layer 3 on the silicon body 1 and an N$^+$-type buried layer 2 between the silicon body 1 and the silicon layer 3. The transistor forming region of the silicon layer 3 is surrounded by an isolation region 5 of silicon oxide, and an insulating film 51, a P-type polycrystalline silicon film 52 and an insulating film 54 are formed in sequence on the silicon layer 3 and on the isolation region 5. An aperture 60 of 1.0 $\mu$m width as the standard aperture mentioned before is formed in the upper insulating film 54 and wider apertures are formed in the P-type polycrystalline silicon film 52 and in the lower insulating film 51 by using the upper insulating film 54 having the aperture 60 as a mask and using side etching phenomenon. Then, a polycrystalline silicon film 53 containing P-type impurities is formed under the upper insulating film 54 and outside the standard aperture 60. The silicon film 53 constitutes a base electrode with the silicon film 52, and a P$^+$-type extrinsic base portion (graft base region) 57 is formed on the surface of the epitaxial silicon layer 3 in a self-aligned manner by using the polycrystalline silicon film 53 as a source of diffusion. Therefore, the P$^+$-type extrinsic base portion 57 is formed at a position outside the standard aperture 60 in the plan view. Next, an insulating film (side wall layer) 55 for isolating emitter and base electrodes is formed inside the aperture 60 and inside the silicon film 53, and a P-type intrinsic base portion 58 is formed on the surface of the epitaxial silicon layer 3 by introducing P-type impurities through an ion-implantation method or the like. Next, a polycrystalline silicon film 56 is formed as the emitter electrode, and an N-type emitter region 59 is formed on the surface of the intrinsic base portion 58 by introducing N-type impurities through an ion-implantation method. The emitter region 59 forms a parasitic emitter-base junction capacitance with the intrinsic base portion at its side 62.

DETAILED DESCRIPTION OF EMBODIMENTS OF THE PRESENT INVENTION

Figure 2A:
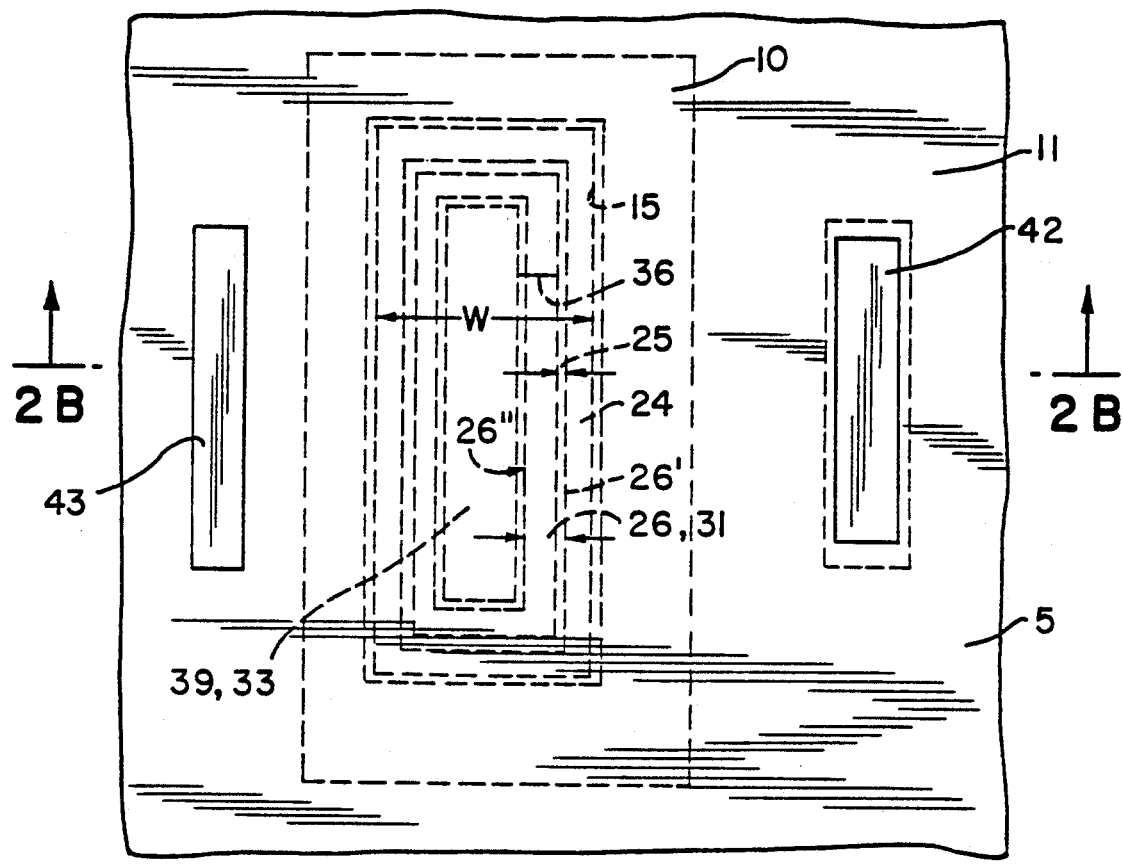
FIG. 2A is a plan view showing a bipolar transistor according to an embodiment of the present invention.
Figure 2B:
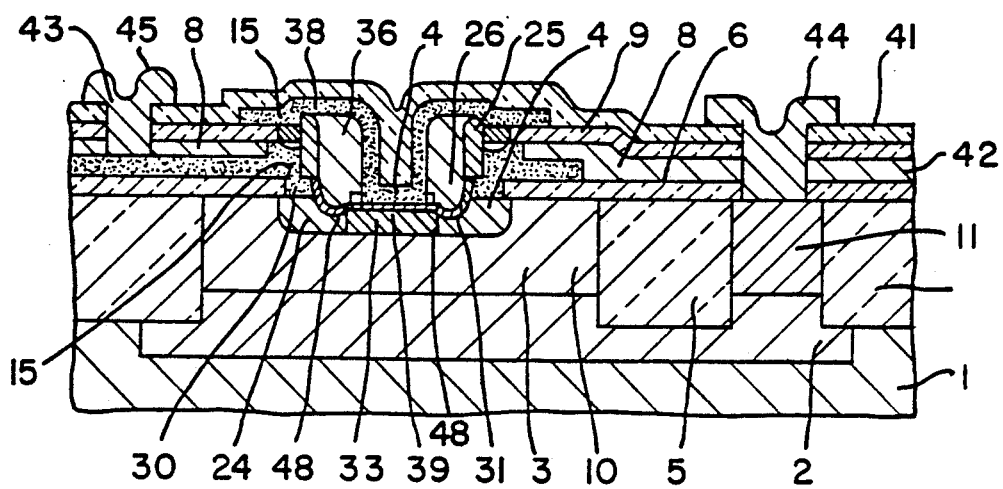
FIG. 2B is a cross-sectional view taken along line B-B' in FIG. 2A as viewed in the direction of arrows.

Referring to FIGS. 2A and 2B, an embodiment of the present invention will be explained. In FIG. 2A, to avoid complexity, only main components for understanding the present invention are schematically shown, and other components are omitted to show. A silicon substrate includes a P-type silicon body 1, an N-type epitaxial (monocrystalline) silicon layer 3 formed on the silicon body 1 and an N$^+$-type baried layer 2 formed between the silicon body 1 and the silicon layer 3. An isolation region 5 of silicon oxide is formed from the surface 4 of the silicon layer 3, that is, of the substrate to the P-type silicon body 1 or to the N$^+$-type buried layer 2 and surrounds a transistor forming region 10 and a collector lead-out region 11 of the silicon layer 3 to delineate these regions. The N$^+$-type buried layer 2 is entirely formed under the transistor forming region 10 and extended under the collector lead-out region 11 which is a high impurity concentration region as the buried layer, by introducing N-type impurities therein. On the upper surface 4 of the silicon layer 3 and on the isolation region 5, a silicon oxide film 6, a silicon nitride film 8 and a silicon oxide film 9 are formed in sequence, and a base electrode 30 of P-type polycrystalline silicon is selectively formed between the lower silicon oxide film 6 and the silicon nitride film 8. An aperture 15 is formed in each of the lower and upper silicon oxide films 6, 9 as the standard aperture having a width W, for example, of 1.0 $\mu$m which is a minimum size accomplished by the conventional photo-lithography technology. On the side of the base electrode, a side wall layer 25 of silicon nitride is formed. The side wall layer 25 is separated from the side of the aperture 15 by 0.1 $\mu$m and has a rectangular ring-like plan shape (FIG. 2A) with the width of 0.1 $\mu$m in the horizontal direction. Another side wall layer 36 of silicon nitride is attached to the inner side of the side wall layer 25 and has a rectangular ring-like plan shape (FIG. 2A) with the width of 0.15 $\mu$m in the horizontal direction. A concavity 26 is formed from the surface into the silicon layer 3 under the side wall layer 36. The concavity 26 has the width of 0.1 $\mu$m in the horizontal direction and the depth of 0.2 $\mu$m, and has a rectangular ring-like plan shape (FIG. 2A), and a thin silicon oxide film 31 covers entirely the surface of the concavity 26. A P$^+$-type extrinsic base portion (graft base region) 24 having boron concentration of $3.0 \times 10^{20}$ cm$^{-3}$ and the depth of 0.4 $\mu$m is formed along the outer side 26' and bottom of the concavity 26, and surrounds the concavity 26 of the ring-like plan shape. Therefore, the extrinsic base portion 24 has also a rectangular ring-like plan shape (FIG. 2A) and contacted to the base electrode 30 in full length (at the all exposed surface portions having the ring-like plan shape). A P-type intrinsic base portion (active base region) 33 having boron concentration of $5 \times 10^{17}$ cm$^{-3}$ and the depth of 0.3 to 0.4 μm is formed along the inner side 26'' and bottom of the concavity 26, and surrounded by the concavity of the ring-like plan shape. The intrinsic base portion 33 is contacted to the extrinsic base portion 24 along the bottom of the concavity, and a passage 48 including a part of the intrinsic base portion and a part of the extrinsic base portion is formed under and in the vicinity of the bottom of the concavity for connecting these base portions 33, 24 to each other. Generally, a section of the passage 48 under the bottom of the concavity is mainly constituted by only a part of the extrinsic base portion. An N-type emitter region 39 having arsenic concentration of $5 \times 10^{20}$ cm$^{-3}$ and the depth of 0.05 to 0.1 μm is formed in the intrinsic base portion 33 and separated from the extrinsic base portion 24. The all side of the emitter region is contacted to the thin silicon oxide film 31 formed in the concavity 26, and only the bottom of the emitter region forms the PN junction with the intrinsic base portion. An emitter electrode 38 of N-type polycrystalline silicon is connected to the surface 4 of the emitter region 39, and a passivation film 41 is entirely deposited. A metallic wiring 44 of aluminum is connected to the collector lead-out portion 11 through a contact hole 42, and a metallic wiring 45 of aluminum is connected to the base electrode 30 through a contact hole 43. Although not shown in the drawings, another metallic wiring is connected to the emitter electrode 38.

Figure 3A:
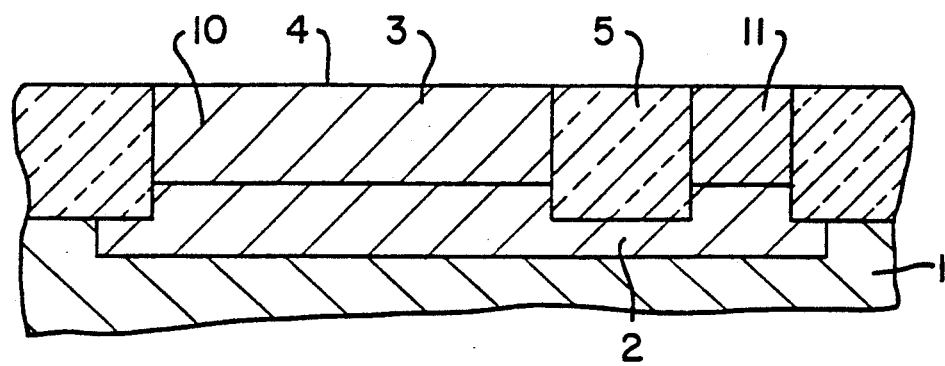
FIGS. 3A to 3N are cross-sectional views showing process steps in sequence for manufacturing the embodiment shown in FIG. 2.
Figure 3B:
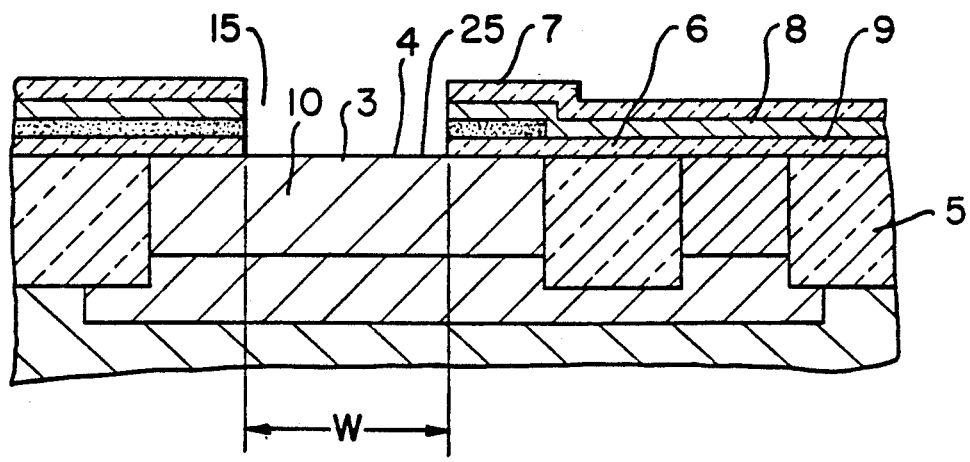
Figure 3C:
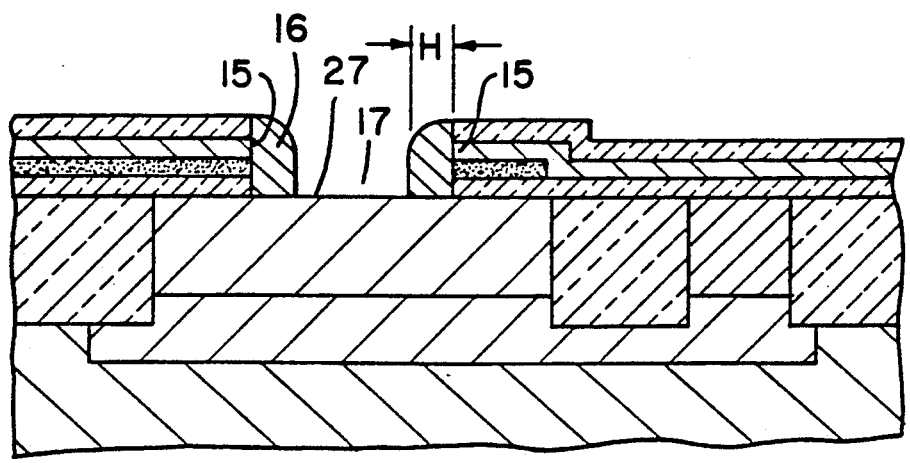
Figure 3D:
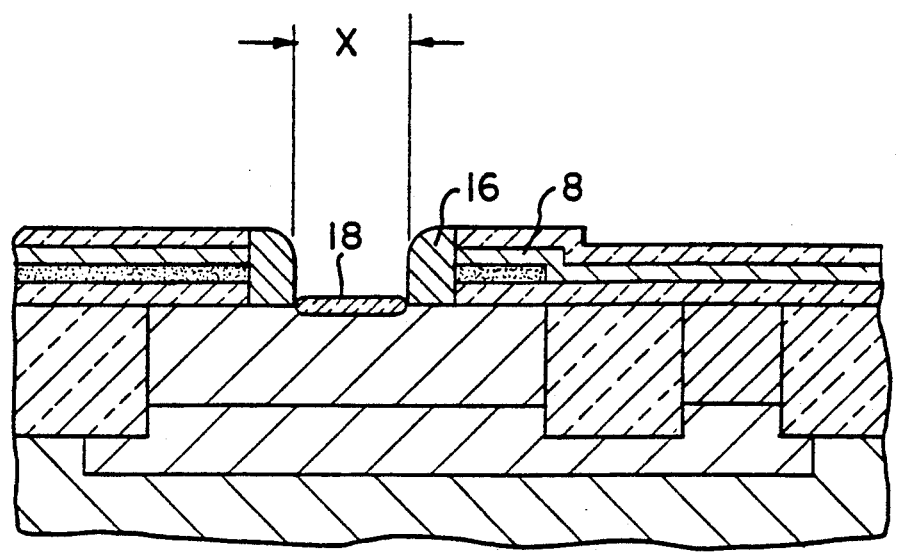
Figure 3E:
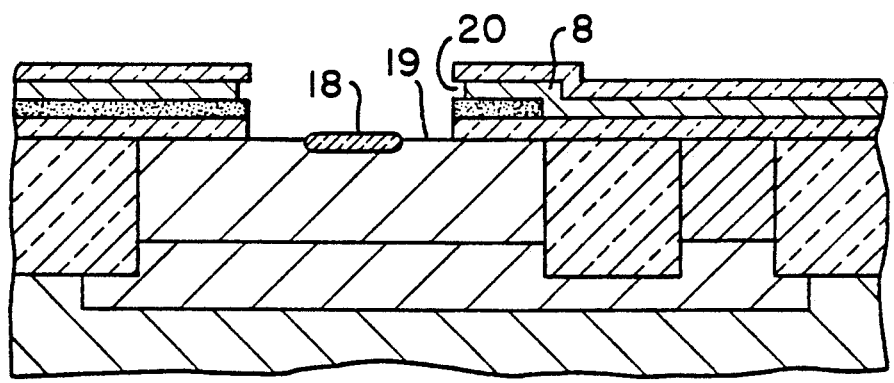
Figure 3F:
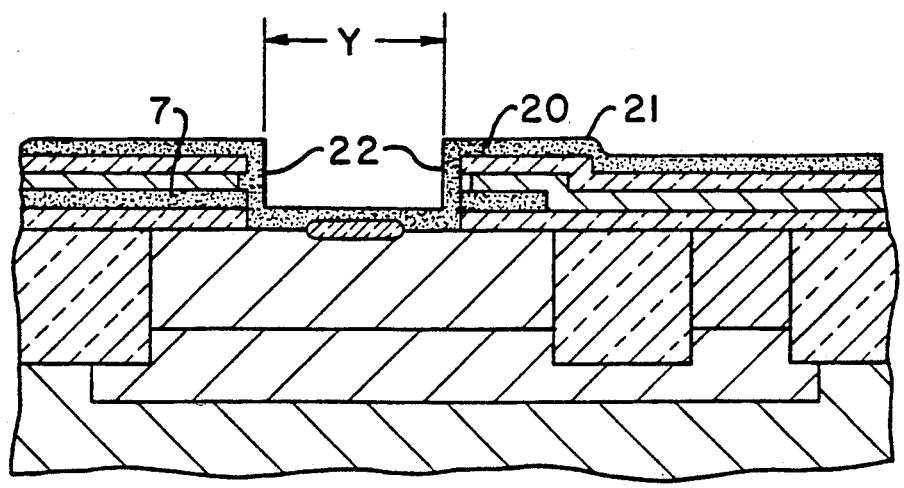
Figure 3G:
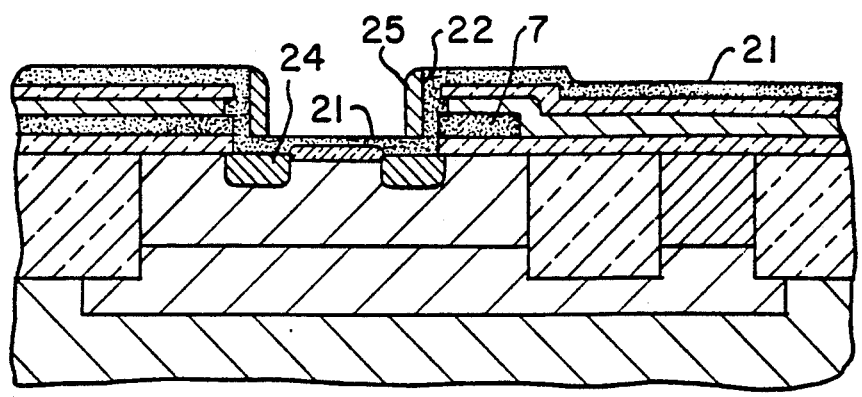
Figure 3H:
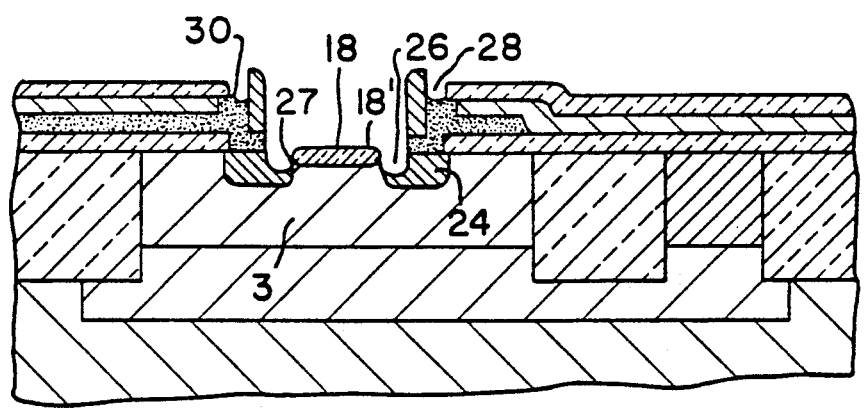
Figure 3I:
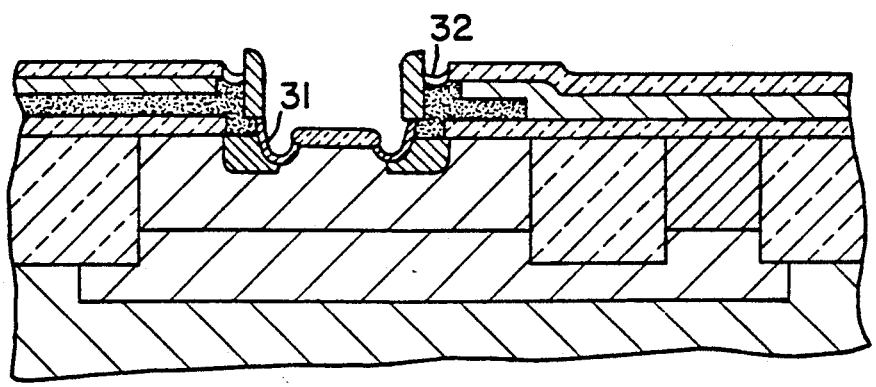
Figure 3J:
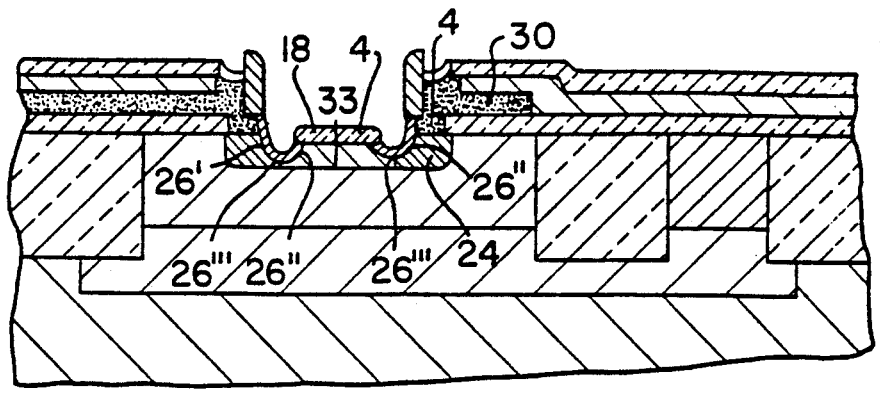
Figure 3K:
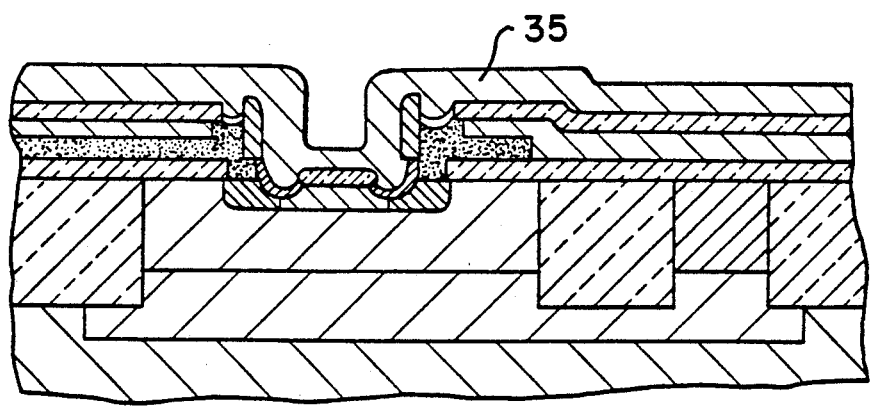
Figure 3L:
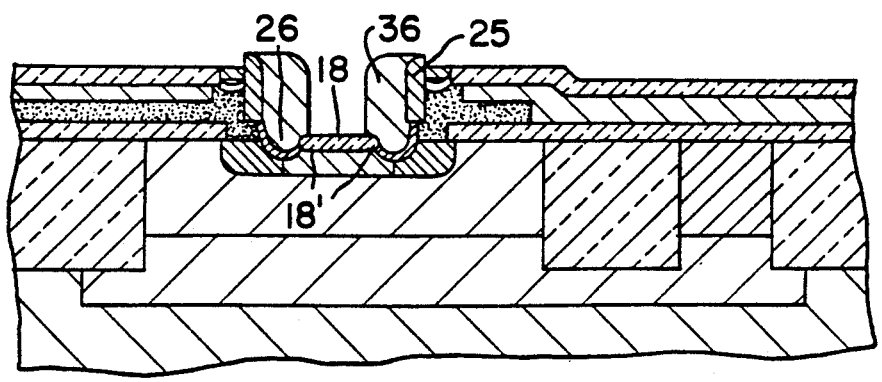
Figure 3M:
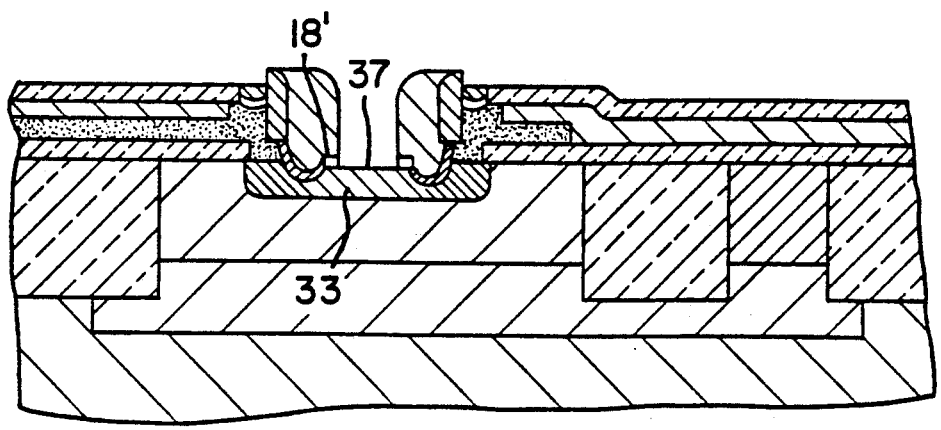
Figure 3N:
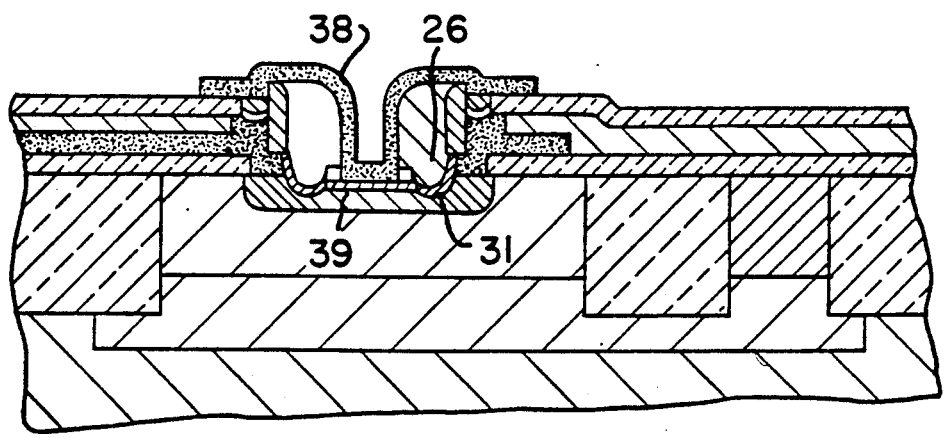

Referring to FIGS. 3A to 3N, process steps for manufacturing the bipolar transistor shown in FIG. 2 will be explained.

On an P-type silicon body 1, the N+-type buried layer 2 is selectively formed and an N-type epitaxial (monocrystalline) silicon layer 3 of 0.5 to 1.0 μm thickness is entirely deposited to constitute the silicon substrate. The isolation region 5 of silicon oxide is selectively formed from the surface 4 of the silicon layer 3 (that is of the substrate) into the buried layer 2 or into the silicon body to delineate the transistor forming region 10 and the collector lead-out region 11. In the collector lead-out region 11 of the epitaxial layer, N-type impurities are introduced to make the lead-out region 11 a higher impurity concentration region than the transistor forming region 10 (FIG. 3A). Next, the first silicon oxide film 6 and a first P-type polycrystalline silicon film 7 are entirely formed in sequence on the surface 4 of the silicon layer 3 and on the isolation region 5, and the P-type silicon film 7 is selectively removed so as to remain a predetermined region thereof including above the transistor forming region 10. Then, after forming the first silicon nitride film 8 as a film resistant against oxidation and the second silicon oxide film 9 in sequence by chemical vapour deposition (hereinafter called as CVD) method, a first aperture 15 having a width W of 1.0 μm is formed in the films 9, 8, 7, 6 by conducting anisotropic etching to these films in sequence so as to expose a first surface section 25 having a width of 1.0 μm of the surface 4 of the N-type epitaxial layer 3. The first aperture 15 is the standard aperture mentioned before having a minimum size W of 1.0 μm accomplished by a photo-lithography technology (FIG. 3B). Next a second silicon nitride film of 0.3 μm thickness is entirely deposited, and reactive ion etching (hereinafter called as RIE) of anisotropic etching is conducted to remove the second silicon nitride film except on the vertical side of the first aperture 15. Consequently, a side wall layer 16 of the second silicon nitride film having the width H of 0.3 μm is provided so as to form a second aperture 17 exposing a second surface section 27 of 0.4 μm width (FIG. 3C). Next, a third silicon oxide film 18 having a thickness of 0.1 μm and a width X of 0.4 μm is formed on the exposed second surface section 27 by a thermal oxidation process step. During the thermal oxidation, the side wall layer 16 of the second silicon nitride film and the first silicon nitride film 8 serve to protect the materials covered by these films 16, 8 from the oxidation (FIG. 3D). Next, the silicon nitride said wall layer 16 is removed by hot phosphoric acid to expose a third surface section 19 which fades an annular peripheral portion of the first surface section 25 (FIG. 3B) excluding the second surface section 27 (FIG. 3C) on which the third silicon oxide film 18 is formed. During the etching step, the side of the first silicon nitride film 8 is etched away to form a cavity 20 (FIG. 3E). Next, a second P-type polycrystalline silicon film 21 having a thickness of 0.1 μm is entirely formed thereby filling the cavity 20 and connecting continuously with the first P-type polycrystalline silicon film 7 at the side of the first aperture 15. Because of the 0.1 μm thickness of the silicon film 21, the width Y between sides 22 of the silicon film 21 becomes 0.8 μm (FIG. 3F). The silicon film 21 may be formed by depositing silicon containing P-type impurities through CVD process step. Or else, P-type impurities may be introduced by an ion-implantation method into a non-doped polycrystalline silicon film deposited by CVD process step, to form the P-type second polycrystalline silicon film. Next, the P+-type extrinsic base portion (graft base region) 24 of boron concentration of $3.0 \times 10^{20}$ cm$^{-3}$ and of 0.4 μm depth is formed by a heat-treatment of 900° C. under inert gas (nitrogen) atmosphere. In this case, even if the second polycrystalline silicon film 21 leaves non-doped state, the graft base region 24 can be formed by introducing borons from the first P-type polycrystalline silicon film 7 through the second silicon film 21. Then, a third silicon nitride film having a thickness of 0.1 μm is entirely deposited, and RIE of anisotropic etching is conducted to remove the third silicon nitride film except on the vertical surface 22 of the second silicon film 21 above the side of the first aperture. Consequently, the side wall layer 25 (FIG. 3G) made of the third silicon nitride film and having a width of 0.1 μm in the horizontal direction is formed on the vertical surface 22 of the second silicon film 21 with a ring-like plan shape (FIG. 3G). Next, RIE is conducted to the exposed portions of the second silicon film 21 to form the base electrode 30 consisting of the first and second P-type polycrystalline silicon films 7, 21. Further, the RIE is continued to form the concavity 26 of the present invention in the epitaxial layer 3 and a concavity 28 in the base electrode 30 of polycrystalline silicon. The major portions of the concavity 26 are of P-type constituted by the P+-type graft base region 24. However, portions 27 attached to and in the vicinity of the edge part 18' of the third silicon oxide film 18 are of N-type constituted by the N-type silicon layer 3 by removing partially the P+-type graft base region. The concavity 26 surrounds the third silicon oxide film 18 in the plan view and has a width of 0.1 μm and a depth of 0.2 μm (FIG. 3H). Next, thin silicon oxide films 31, 32 having a thickness of 0.05 μm are formed on the exposed concavities 26, 28, respectively, by a heat-treatment at 900° C. under oxygen or steam atmosphere (FIG. 3I). By the formation of the thermal oxide silicon film 31, the portions of N-type of the concavity are elongated from the edge part 18' of the silicon oxide film 18. Next, a P-type intrinsic base portion (active base region) 33 having a boron concentration of $5 \times 10^{17}$ cm$^{-3}$ and having a depth of 0.3 to 0.4 μm from the surface 4 under the silicon oxide film 18 (the surface is depressed from the surface 4 contacted to the base electrode 30 by about 0.05 μm) is formed by ion-implatation of boron ions through the silicon oxide film 18 followed by annealing for activation. The extrinsic base portion is formed along the outside 26' of the concavity 26, and the intrinsic base portion is formed along the inside 26" of the concavity 26. A part of the intrinsic base portion and a part of the extrinsic base portion are formed along the bottom 26'" of the concavity 26 to form the passage (48 in FIG. 2B) for connecting both portions to each other (FIG. 3J). Next, a fourth silicon nitride film 35 having a thickness of 0.15 μm is entirely deposited by CVD (FIG. 3K). Then, RIE of anisotropic etching is conducted to remove the fourth silicon nitride film except on the vertical surface of the side wall layer 25. Therefore, another side wall layer 36 made of the fourth silicon nitride film and having a width of 0.15 μm in the horizontal direction is formed on the vertical surface of the side wall layer 25 and on and within the concavity 26 with a ring-like plan shape. Further, the side wall layer 36 covers the edge parts 18' of the silicon oxide film 18 by 0.05 μm width in the horizontal direction (FIG. 3L). The formations of the side wall layer 16 in FIG. 3C and of the side wall layer 25 in FIG. 3G are the same as the formation of the side wall layer 36 in FIGS. 3K and 3L. Next, the silicon oxide film 18 is removed except the edge parts 18' by RIE to expose the surface section 37 of the active base region 33 (FIG. 3M). Next, a polycrystalline silicon film is entirely formed, and the N-type emitter region 39 of impurity concentration of $5 \times 10^{20}$ cm$^{-3}$ and depth of 0.05 to 0.1 μm is formed in the active base region 33 by ion-implantation of arsenic ions through the silicon film followed by annealing at 900 to 950° C. for activation. Then, the silicon film is patterned to form the emitter electrode 38 (FIG. 3N).

Thereafter, as shown in FIG. 2B, after forming the passivation film 41 of phosphosilicate glass (PSG) entirely, contact holes 42 and 43 are formed, and wirings 44 and 45 of metallic material such as aluminum are connected to the N$^+$-type collector-lead out region 11 and to the base electrode 30 through the contact holes 42 and 43, respectively.

Figure 4A:
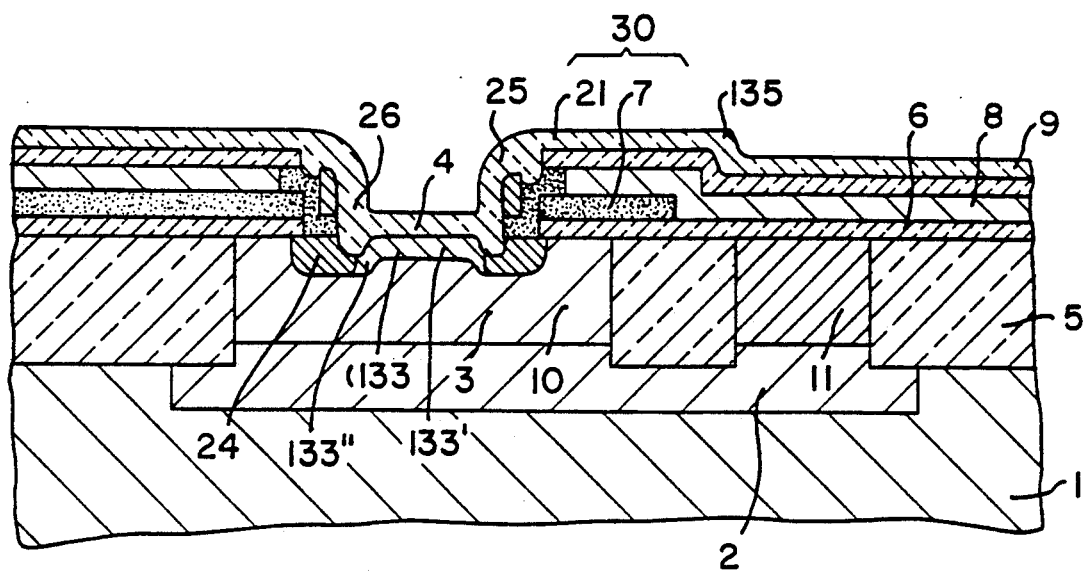
FIGS. 4A and 4B are cross-sectional views showing a part of process steps for manufacturing another embodiment of the present invention.
Figure 4B:
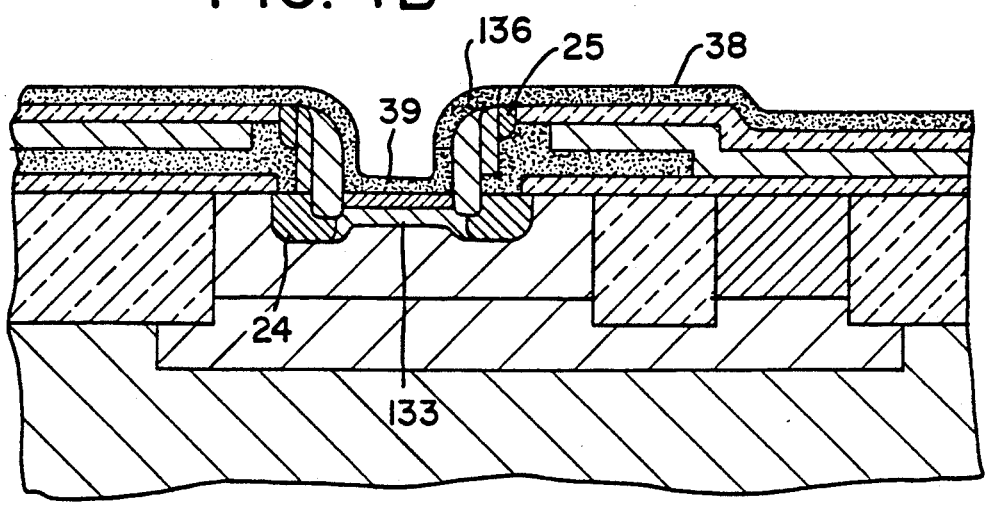

Referring to FIGS. 4A and 4B, another embodiment of the present invention will be explained. In FIGS. 4A and 4B, the same components as those in FIGS. 2 and 3 are indicated by the same reference numerals. After the process step shown in FIG. 3H, the silicon oxide film 18 is removed, and a silicon oxide film 135 containing P-type impurities such as borons are entirely deposited by CVD method so that the film 135 is directly contacted to the surface 4 and to the wall of the concavity 26. Then, a heat-treatment is conducted at 900 to 1000° C. during a short time to form an intrinsic base portion 133 by using the film 135 containing borons as a impurity source. The center part 133' of the intrinsic base portion 133 has the depth of 0.2 μm from the surface 4, and the peripheral part 133" of the intrinsic base portion 133 attached to the concavity 26 has the depth of 0.4 μm from the surface 4 because of introduction of borons from the concavity side (FIG. 4A). Next, RIE of anisotropic etching is conducted to form a side wall layer 136 from the silicon oxide film 135 containing borons. That is, the side wall layer 136 corresponds to the thin silicon oxide 31 and the side wall layer 36 of silicon nitride in FIG. 2. Then, the N-type emitter region 39 is formed by the same process step shown in FIG. 3N. The side of the emitter region 39 is directly contacted to the side wall layer 136 of silicon oxide containing borons formed in the concavity (FIG. 4B). In this embodiment, the surface of the concavity is not thermally oxidized. Therefore, the impurity concentration is not decreased in the surface of the extrinsic base portion by the thermal oxidation, thereby preventing unfavorable increase of the base resistance at the portion.

What is claimed is:

1. A method of manufacturing a bipolar transistor, said method comprising the sequential steps of;

forming a covering layer on a surface of a semiconductor substrate, said substrate being of a first conductivity type;

forming an aperture in said covering layer to expose a section of said surface of said substrate;

forming a side wall layer made of material resistant to oxidation on a peripheral part of said section and on said covering layer within said aperture to expose a center part of said section;

carrying out a heat treatment under oxidizing atmosphere to form an oxide film on said exposed center part of said section of said surface;

removing said side wall layer to expose said peripheral part of said section of said surface;

introducing impurities of a second conductivity type, opposite to said first conductivity type, into said peripheral part to form an extrinsic base portion of said second conductivity type contacting an edge of said oxide film;

forming a concavity in said peripheral part of said surface section at a position adjacent said edge of said oxide film such that (1) first wall portions of said concavity, including the bottom of said concavity remote from said edge of said oxide film, are of said second conductivity type constituted by said extrinsic base portion and (2) second wall portions of said concavity in contact with and in the vicinity of said edge of said oxide film are of said first conductivity type;

forming an insulating film within said concavity to entirely cover said first and second wall portions;

forming an intrinsic base portion of said second conductivity type in said center part of said surface section and along said cavity and in contact with said extrinsic base portion; and forming an emitter region of said first conductivity type within said intrinsic base portion such that said emitter region is in contact with said insulating film within said concavity at its side.

2. The method of claim 1, wherein said extrinsic base portion has an impurity concentration higher than that of said intrinsic base portion.

3. The method of claim 1, further including the step of forming a polycrystalline silicon electrode in contact with said emitter region.

4. The method of claim 1, wherein said insulation film forming step comprises the steps of forming a thin silicon oxide film directly attached to said first and second walls of said concavity and forming a silicon nitride layer on said thin silicon oxide film to fill said concavity.

5. The method of claim 1, wherein said insulating film forming step comprises the step of attaching a silicon oxide layer containing impurities directly to said first and second wall portions of said concavity.

6. The method of claim 1, wherein said step of forming a side wall layer comprises the steps of depositing a material resistant to oxidation on the entire said section of said surface of said substrate and thereafter removing the portion of said oxidation resistant material not located on said peripheral part of said section.

7. The method of claim 6, wherein said oxidation resistant material is a silicon nitride film.

8. The method of claim 7, wherein said step of removing said side wall layer comprises the step of removing said silicon nitride by hot phosphoric acid.

* * * * *